United States Patent
Sakai et al.

(10) Patent No.: US 7,371,631 B2
(45) Date of Patent: May 13, 2008

(54) METHOD OF MANUFACTURING A NONVOLATILE SEMICONDUCTOR MEMORY DEVICE, AND A NONVOLATILE SEMICONDUCTOR MEMORY DEVICE

(75) Inventors: Takeshi Sakai, Hitachinaka (JP); Yasushi Ishii, Mito (JP); Tsutomu Okazaki, Itami (JP); Masaru Nakamichi, Hitachinaka (JP); Toshikazu Matsui, Kodaira (JP); Kyoya Nitta, Kokubunji (JP); Satoru Machida, Hitachinaka (JP); Munekatsu Nakagawa, Hitachinaka (JP); Yuichi Tsukada, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 378 days.

(21) Appl. No.: 11/168,639

(22) Filed: Jun. 29, 2005

(65) Prior Publication Data
US 2006/0003508 A1    Jan. 5, 2006

(30) Foreign Application Priority Data
Jun. 30, 2004   (JP) ............................. 2004-193554

(51) Int. Cl.
*H01L 21/336*   (2006.01)
(52) U.S. Cl. ............... 438/201; 438/258; 438/304; 257/E21.689
(58) Field of Classification Search .............. 438/201, 438/258, 304, 596; 257/E21.689
See application file for complete search history.

(56) References Cited

U.S. PATENT DOCUMENTS

| | | | |
|---|---|---|---|
| 5,838,041 A * | 11/1998 | Sakagami et al. .......... 257/324 |
| 5,969,383 A | 10/1999 | Chang et al. | |
| 6,255,166 B1 | 7/2001 | Ogura et al. | |
| 6,706,579 B2 * | 3/2004 | Kasuya ....................... 438/201 |
| 2003/0198086 A1 | 10/2003 | Shukuri | |
| 2004/0119107 A1 | 6/2004 | Hisamoto et al. | |
| 2004/0155234 A1 | 8/2004 | Ishimaru et al. | |
| 2004/0185617 A1 | 9/2004 | Shukuri | |

FOREIGN PATENT DOCUMENTS

| | | |
|---|---|---|
| EP | 1416540 A1 | 5/2004 |
| JP | 2001-102466 | 4/2001 |

* cited by examiner

*Primary Examiner*—Chandra Chaudhari
(74) *Attorney, Agent, or Firm*—Antonelli, Terry, Stout & Kraus, LLP.

(57) ABSTRACT

For enhancing the high performance of a non-volatile semiconductor memory device having an MONOS type transistor, a non-volatile semiconductor memory device is provided with MONOS type transistors having improved performance in which the memory cell of an MONOS non-volatile memory comprises a control transistor and a memory transistor. A control gate of the control transistor comprises an n-type polycrystal silicon film and is formed over a gate insulative film comprising a silicon oxide film. A memory gate of the memory transistor comprises an n-type polycrystal silicon film and is disposed on one of the side walls of the control gate. The memory gate comprises a doped polycrystal silicon film with a sheet resistance lower than that of the control gate comprising a polycrystal silicon film formed by ion implantation of impurities to the undoped silicon film.

15 Claims, 22 Drawing Sheets

METHOD OF MANUFACTURING A NONVOLATILE SEMICONDUCTOR MEMORY DEVICE, AND A NONVOLATILE SEMICONDUCTOR MEMORY DEVICE

CROSS REFERENCE TO RELATED APPLICATION

The present application claims priority from Japanese patent application No. 2004-193554, filed on Jun. 30, 2004, the content of which is hereby incorporated by reference into this application.

BACKGROUND OF THE INVENTION

The present invention relates in general to a non-volatile semiconductor memory device and to a technique for the manufacture thereof; and, more in particular, it relates to a technique which is effective when applied to the manufacture of a non-volatile semiconductor memory device having an MONOS (Metal Oxide Nitride Oxide Semiconductor) type transistor.

A split gate type memory cell structure using a MONOS (Metal Oxide Nitride Oxide Semiconductor) film has been employed to form an electrically erasable and programmable read only memory (non-volatile memory).

Since the MONOS type non-volatile memory performs writing by accumulating charges to a silicon nitride film in the memory cell, it has the following advantages over a flash memory, in which charges are accumulated to a floating gate comprising a polycrystal silicon film:

(1) it has excellent reliability of data retention, since electric charges are accumulated dispersingly; and (2) a writing operation and an erasing operation can be conducted at a low voltage, since the thickness of two layered silicon oxide films with a silicon nitride film disposed therebetween can be decreased.

The methods employed for erasing data in a MONOS type non-volatile memory can be divided into two types, that is, a BTBT (Band-To-Band Tunneling) hot hole injection method and a tunneling method, the former being described, for example, in Patent Document 1 (U.S. Pat. No. 5,969,383), and the latter being described, for example, in Patent Document 2 (Japanese unexamined patent publication No. 2001-102466).

In the BTBT hot hole injection method, erasing is conducted by applying a high voltage between a source region and a gate electrode by injecting holes generated by BTBT into a silicon nitride film. On the other hand, the tunneling erasing method operates to effect erasing by withdrawing electrons injected into the silicon nitride film to the substrate or the gate electrode.

[Patent Document 1]
U.S. Pat. No. 5,969,383

[Patent Document 2]
Japanese Unexamined Patent Publication No. 2001-102466 (corresponding to U.S. Pat. No. 6,255,166)

SUMMARY OF THE INVENTION

In a MONOS type non-volatile memory under development by the present inventors, a memory cell is constituted to have a control transistor and a memory transistor. The memory cell comprises a control gate formed over a p-type well in the main surface of a semiconductor substrate by way of a gate insulative film; a charge accumulation layer, a portion of which is formed to one of the side walls of the control gate and the other portion of which is formed over the first p-type well; a memory gate, which is formed to one of the side walls of the control gate, is electrically separated by way of the portion of the charge accumulation layer from the control gate and is electrically separated by way of the other portion of the charge accumulation layer from the first p-type well; a second conduction type drain region formed to the surface of the first p-type well, with one end thereof being disposed near the control gate; and a second conduction type source region formed to the surface of the first p-type well, with one end thereof being disposed near the memory gate. The charge accumulation layer is constituted with two layered silicon oxide films and a silicon nitride film disposed therebetween.

The MONOS type non-volatile memory adopts the BTBT hot hole injection method as the method used for erasing data. That is, it conducts writing by injecting hot electrons generated in the channel region near the intermediate portion between the control gate and the memory gate into the charge accumulation layer, and it conducts erasing by injecting hot holes generated in the channel region at the end of the source region into the charge accumulation layer.

By the way, since the electrons or holes injected into the charge accumulation layer are captured by traps in the silicon nitride film and can not move freely in the silicon nitride film, in a case where the location for generating the hot electrons and the location for generating the hot holes are spaced apart, the position for the electrons and the position for the holes injected into the charge accumulation layer are also spaced apart; and, as a result, the erasing efficiency of electrons by the holes is lowered, which results in problems, such as a delay in the erasing time, a deterioration of the rewriting resistance and a deterioration of the data retention characteristics.

Further, in the reading of data, a positive voltage is applied to the control gate of a selected memory cell to turn the control transistor ON, and the voltage applied to the memory gate is set between a threshold voltage for the memory transistor in the writing state and a threshold voltage of the memory transistor in the erasing state to distinguish the writing state from the erasing state.

Accordingly, for conducting a reading operation at high speed, it is necessary to conduct ON/OFF operation of the control transistor at a high speed between the selected memory cell and the not-selected memory cell. In this case, since switching noises are generated in the memory gate based on the impedance, the noises are increased so as to cause a reading error in a case where the resistance of the memory gate is high.

It is an object of the present invention to provide a technique that is capable of enhancing the high performance of a non-volatile semiconductor memory device having an MONOS type transistor.

It is a further object of the present invention to provide a technique that is capable of simplifying the steps employed for manufacture of a non-volatile semiconductor memory device having a MONOS type transistor.

The forgoing and other objects and novel features of the present invention will become more apparent from the following descriptions provided in this specification when taken in conjunction with the accompanying drawing.

An outline of typical aspects and features of the present invention as disclosed in the present application will be described below.

The present invention provides a method of manufacturing a non-volatile semiconductor memory device having a memory cell comprising a control gate formed over a p-type well in the main surface of a semiconductor substrate through a gate insulative film; a charge accumulation layer having a first portion formed on one of the side walls of the control gate and a second portion formed over the first p-type well; a memory gate, which is formed on one of the side walls of the control gate, is electrically separated by the first portion of the charge accumulation layer from the control gate and is electrically separated by the second portion of the charge accumulation layer from the first p-type well; a second conduction type drain region formed in the first p-type well, with one end thereof being disposed near the control gate; and a second conduction type source region formed in the first p-type well, with one end thereof being disposed near the memory gate. The charge accumulation layer is constituted with two layered silicon oxide films and a silicon nitride film formed therebetween. The method comprises the steps of:
  (a) forming the first gate insulative film over the surface of the first p-type well and then forming an undoped silicon film over the first gate insulative film;
  (b) ion implanting impurities in the undoped silicon film for converting the undoped silicon film into an n-type first silicon film;
  (c) patterning the n-type silicon film, and the first gate insulative film thereby forming the control gate comprising the n-type first silicon film, while leaving the first gate insulative film below the control gate;
  (d) forming a first insulative film so as to cover the surface of the first p-type well and the side walls and the upper surface of the control gate;
  (e) forming an n-type second silicon film over the first insulative film, and then patterning the n-type second silicon film, thereby forming the memory gate comprising the n-type second silicon film to one of side walls of the control gate;
  (f) removing the first insulative film in a region not in contact with the memory gate, thereby forming the charge accumulation layer comprising the first insulative film, with a first portion thereof being disposed to one of the side walls of the control gate and with a second portion thereof being disposed over the first p-type well; and
  (g) ion implanting impurities in the first p-type well, thereby forming the drain region of the second conductive type, with one end thereof being disposed near the control gate, and the source region of the second conductive type, with one end thereof being disposed near memory gate.

The effects obtained by typical aspects of the invention as disclosed in the present application will be described simply below.

The reading operation of the non-volatile semiconductor memory device having a MONOS type transistor can be conducted at high speed.

Further, the manufacturing steps used for fabrication of the non-volatile semiconductor memory device having the MONOS type transistor can be simplified.

DETAILED DESCRIPTION OF THE PREFERRED EMBODIMENTS

Figure 1:
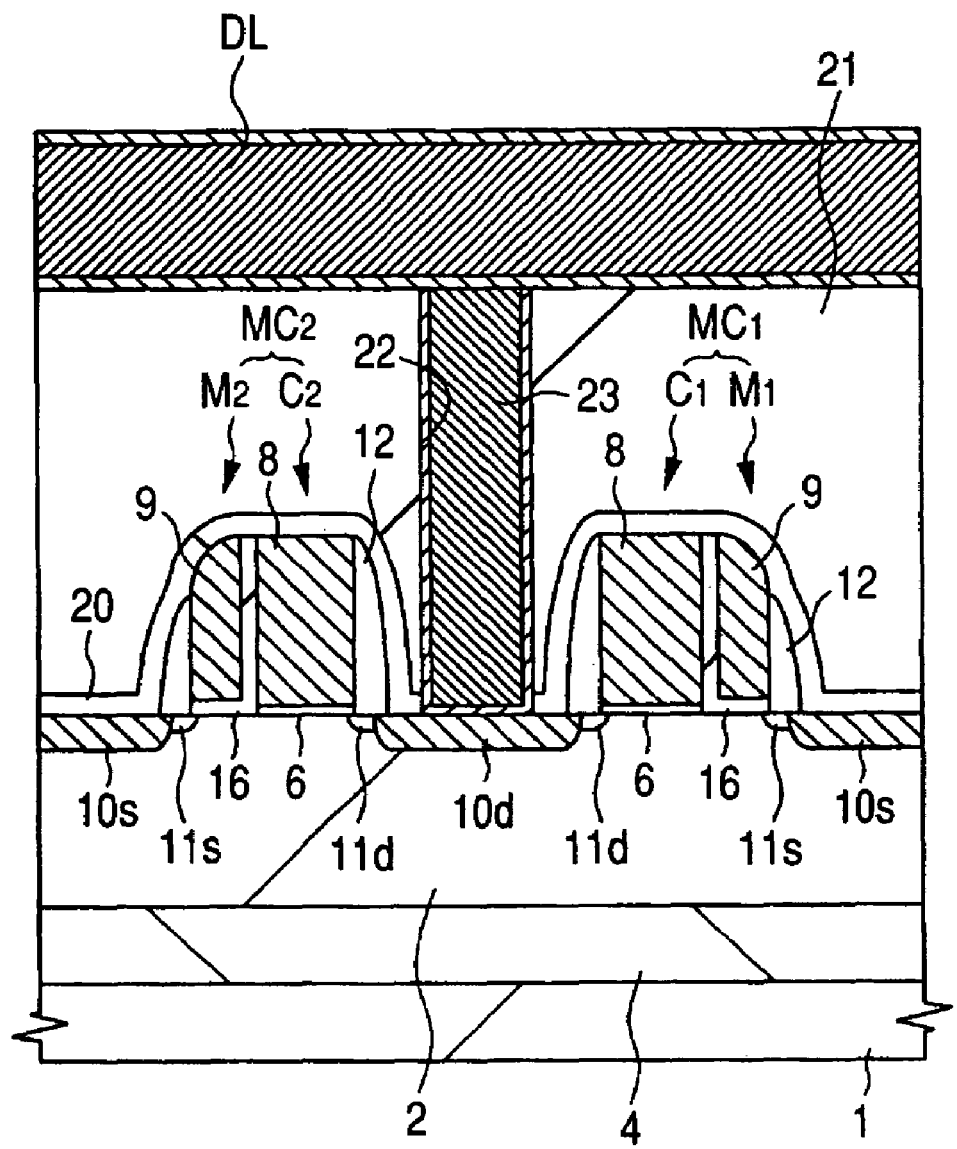
FIG. 1 is a cross sectional view of a main portion of a semiconductor substrate showing an MONOS type non-volatile memory representing a preferred embodiment according to the present invention.

Preferred embodiments of the present invention will be described specifically with reference to the drawings. Throughout the drawings, identical members carry the same reference numerals in principle, and duplicate descriptions thereof are omitted.

Figure 2:
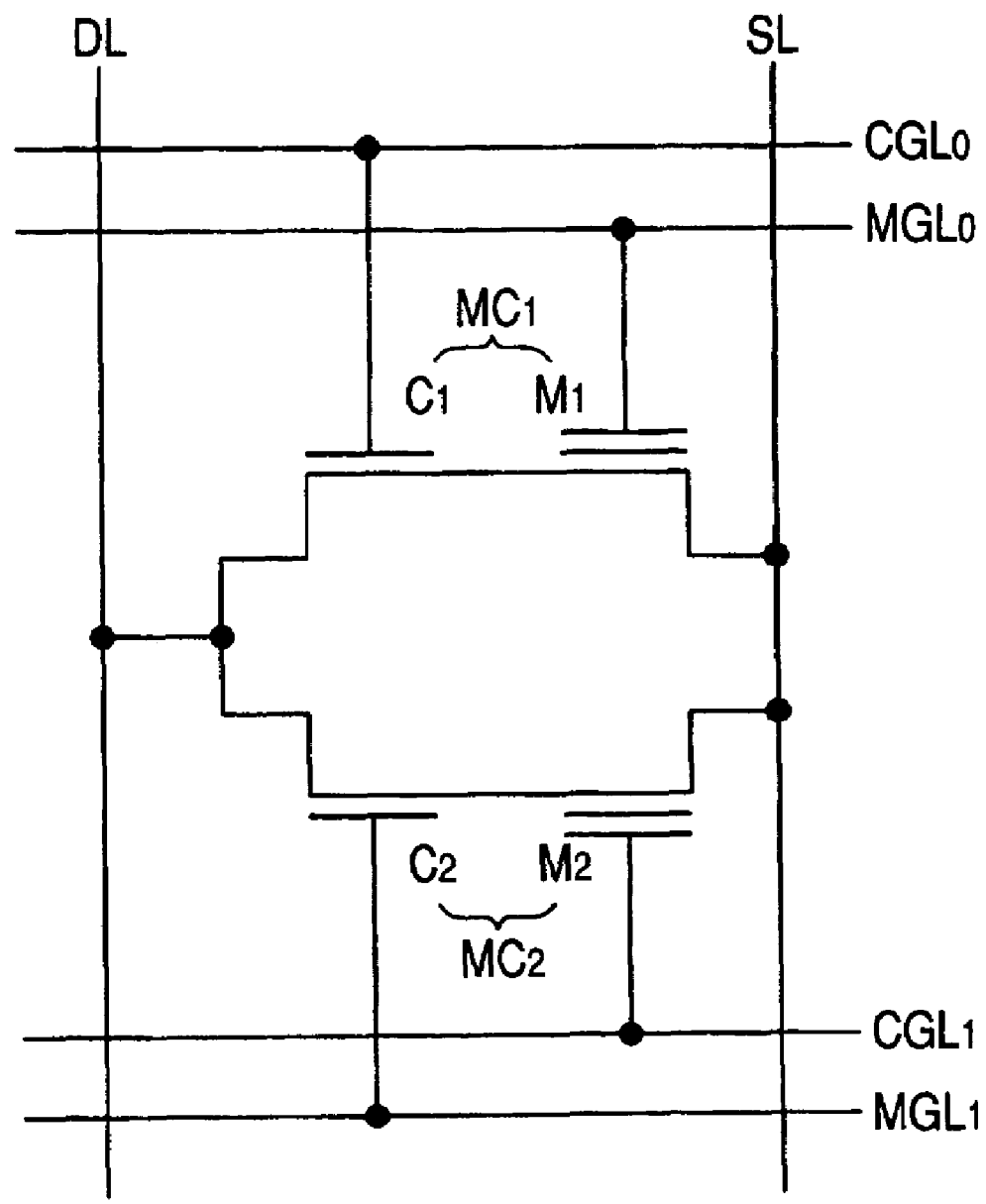
FIG. 2 is an equivalent circuit diagram of the MONOS type non-volatile memory shown in FIG. 1.

FIG. 1 is a cross sectional view of a main portion of an MONOS type non-volatile memory in accordance with this embodiment, and FIG. 2 is an equivalent circuit diagram of the MONOS type non-volatile memory shown in FIG. 1. FIG. 1 and FIG. 2 show two memory cells ($MC_1$ and $MC_2$) disposed adjacent to each other.

The memory cell ($MC_1$) of an MONOS type non-volatile memory is formed to a p-type well 2 of a semiconductor substrate 1 comprising a p-type single crystal silicon (hereinafter simply referred to as a substrate). The p-type well 2 is electrically separated by way of an n-type buried layer 4 for well isolation from the substrate 1, to which a desired voltage is applied.

The memory cell ($MC_1$) comprises a control transistor ($C_1$) and a memory transistor ($M_1$). The gate electrode (control gate 8) of the control transistor ($C_1$) comprises, for example, an n-type polycrystal silicon film serving as a conductive film, which is formed over a gate insulative film 6 comprising a silicon oxide film. Further, the gate electrode (memory gate 9) of the memory transistor ($M_1$) comprises, for example, an n-type polycrystal silicon film, as a conductive film, which is disposed to one of the side walls of the control gate 8. The memory gate 9 is electrically separated from the control gate 8 and the p-type well 2 by way of a charge accumulation layer 16, a portion of which is formed to one of the side walls of the control gate 8 and the other portion of which is formed over the p-type well 2. The charge accumulation layer 16 comprises two layered silicon oxide films and a silicon nitride film formed therebetween. Upon data writing, hot electrons generated in the channel region are injected into the charge accumulation layer 16 and are captured by traps in the silicon nitride film.

An $n^+$-type semiconductor region 10$d$, that functions as a drain region of the memory cell ($MC_1$), is formed to the p-type well 2 near the control gate 8. Further, an $n^+$-type semiconductor region 10$s$, that functions as a source region for the memory ($MC_1$), is formed to the p-type well 2 near the memory gate 9.

An $n^-$-type semiconductor region 11$d$, having a concentration of the impurities that is lower than that of the $n^+$-type semiconductor region 10$d$ is formed to the p-type well 2 in a region adjacent to the $n^+$-type semiconductor region (drain region) 10$d$. The $n^-$-type semiconductor region 11$d$ is an extension region for moderating a high electric field at the end of the $n^+$-type semiconductor region (drain region) 10$d$ for forming the control transistor ($C_1$) into an LDD (Lightly Doped Drain) structure. Further, an $n^-$-type semiconductor region 11$s$, having a concentration of the impurities that is lower than that of the $n^+$-type semiconductor region 10$s$, is formed to the p-type well 2 in a region adjacent with the $n^+$-type semiconductor region (source region) 10$s$. The $n^-$-type semiconductor region 11$s$ is an extension region for moderating a high electric field at the end of the $n^+$-type semiconductor region (source region) 10$s$ for forming the control transistor ($M_1$) into an LDD structure.

Side wall spacers 12 comprising a silicon oxide film are formed to the other of the side walls of the control gate 8 and one of side walls of the memory gate 9, respectively. The side wall spacers 12 are utilized for forming the $n^+$-type semiconductor region (drain region) 10$d$ and the $n^+$-type semiconductor region (source region) 10$s$.

A data line (DL) is formed over the memory cell ($MC_1$), which is constituted as described above, by way of a silicon nitride film 20 and a silicon oxide film 21. The data line (DL) is electrically connected by way of a plug 23 in a contact hole 22, which is formed above the $n^+$-type semiconductor region (drain region) 10$d$, with the $n^+$-type semiconductor region (drain region) 10$d$. The data line (DL) comprises a metal film mainly composed of an aluminum alloy, and the plug 23 comprises a metal film mainly composed of tungsten.

As shown in FIG. 2, the control gate 8 of the control transistor ($C_1$) is connected with a control gate line ($CGL_0$), and the memory gate 9 of the memory transistor ($M_1$) is connected with a memory gate line ($MGL_0$). Further, the source region 10$s$ is connected with a source line (SL), and a desired voltage is applied to the p-type well 2 through a not illustrated power supply line.

The memory cell ($MC_2$), which is disposed adjacent with the memory cell ($MC_1$), has the identical structure as that of the memory ($MC_1$), and the drain region 10$d$ is provided in common with the drain region 10$d$ of the memory cell ($MC_1$). As described above, the drain region 10$d$ is connected with the data line (DL). The two memory cells ($MC_1$ and $MC_2$) are arranged so as to be symmetrical with respect to the common drain region 10$d$. The control gate 8 of the control transistor ($C_2$) is connected with the control gate line ($CGL_1$), and the memory gate 9 of the memory transistor ($M_2$) is connected with the memory gate line ($MGL_1$). Further, the source region 10$s$ is connected with the source line (SL).

Now, each of writing, erasing and reading operations in a case where the memory cell ($MC_1$) is a selected memory cell will be described. Injection of electrons to the charge accumulation layer 16 is defined as "writing", and injection of holes is defined as "erasing" herein.

For the writing, a hot electron writing method, i.e. a so-called source side injection method, is adopted. Upon writing, voltages are applied at 0.7 V to the control gate 8, at 10 V to the memory gate 9, at 6 V to the source region 10$s$, at 0 V to the drain region, and at 0 V to the p-type well 2. Then, hot electrons are generated in the region near the intermediate portion between the control gate 8 and the memory gate 9 in the channel region formed between the source region 10$s$ and the drain region 10$d$, which hot electrons are injected into the charge accumulation layer 16. The injected electrons are captured at traps in the silicon nitride film, and the threshold voltage of the memory transistor ($M_1$) increases.

For erasing, a hot hole injection erasing method that utilizes a channel current is adopted. Upon erasing, voltages are applied at 0.7 V to the control gate 8, at −8 V to the memory gate 9, at 7 V to the source region 10$s$, at 0 V to the drain region, and at 0 V to the p-type well 2. Then, a channel region is formed to the p-type well 2 below the control gate 8. Further, since a high voltage (7V) is applied to the source region 10*s*, a depletion layer extends from the source region 10*s* and approaches the channel region of the control transistor ($C_1$). As a result, electrons flowing through the channel region are accelerated by a high electric field between the end of the channel region and the source region 10*s* so as to cause impact ionization, and electron-hole pairs are formed. Then, the holes are accelerated by the negative voltage (−8V) applied to the memory gate 9 to form hot holes, which are injected into the charge accumulation layer 16. The injected holes are captured at the traps in the silicon nitride film so as to lower the threshold voltage of the memory transistor ($M_1$).

Upon reading, voltages are applied at 1.5 V to the control gate 8, at 1.5 V to the memory gate 9, at 0 V to the source region 10*s*, at 1.5 V to the drain region, and at 0 V to the p-type well 2. That is, the voltage applied to the memory gate 9 is set between a threshold voltage for the memory transistor ($M_1$) in the writing state and a threshold voltage for the memory transistor ($M_1$) in the erasing state so as to discriminate the writing state from the erasing state.

As described above, in the MONOS type non-volatile memory, reading is conducted in a state in which a voltage is applied to the control gate 8 of the selected memory cell to turn the control transistor ($C_1$) ON and a voltage is applied to the memory gate 9. Accordingly, for conducting the reading operation at a high speed, it is necessary to turn ON/OFF the control transistor at a high speed between the selected memory cell and a not-selected memory cell. In this case, since switching noises are generated at the memory gate 9 on the basis of the impedance thereof, in a case where the resistance of the memory gate 9 is high, the noises are increased, resulting in a reading error. As will be described later, since the resistance of the n-type polycrystal silicon film that constitutes the memory gate 9 is low in the MONOS type non-volatile memory of this embodiment, such increase of the noises can be suppressed, making it possible to conduct the reading operation at a high speed.

Now, a method of manufacturing the MONOS type no-volatile memory will be described in the sequence of the steps thereof with reference to FIG. 3 to FIG. 20.

Figure 3:
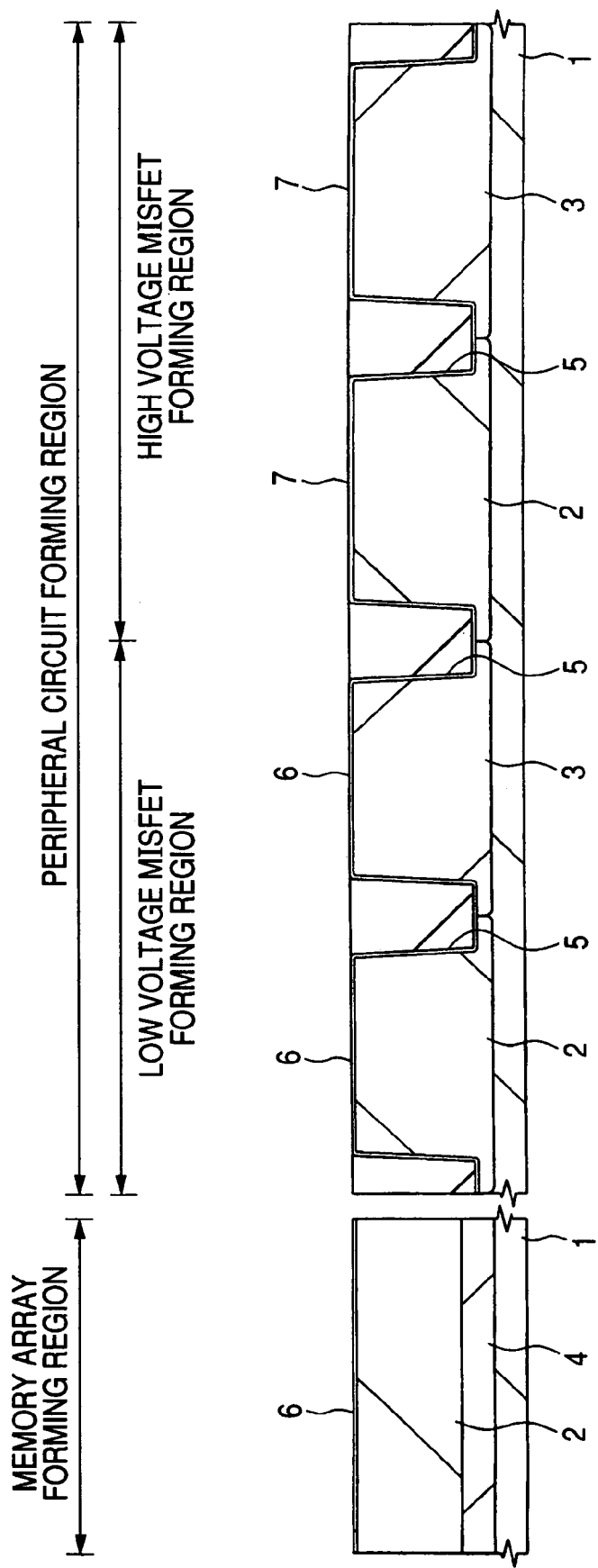
FIG. 3 is a cross sectional view of a main portion showing a step in the method of manufacturing an MONOS type non-volatile memory representing a preferred embodiment of the invention.

At first, as shown in FIG. 3, after forming device isolation trenches 5 in the main surface of a substrate 1 by using a well-known manufacturing method, an n-type buried layer 4 and a p-type well 2 are formed in the main surface of the substrate 1 in the memory array forming region and a p-type well 2 and an n-type well 3 are formed in the main surface of the substrate 1 in a peripheral circuit forming region. The peripheral circuit of the MONOS type non-volatile memory includes, for example, circuits constituted by a low voltage withstanding MISFET, such as a sense amplifier, a column decoder and a row decoder, and circuits constituted by a high voltage withstanding MISFET, such as a voltage step-up circuit. Accordingly, the drawing shows a memory array forming region, a low voltage MISFET forming region, and a high voltage withstanding MISFET forming region.

Then, by thermally oxidizing the substrate 1, gate insulative films 6, 7 comprising silicon oxide are formed to the respective surfaces of the p-type well 2 and the n-type well 3. The gate insulative film 6 is formed to the memory array forming region and the low voltage withstanding MISFET forming region, and the gate insulative film 7 is formed to the high voltage withstanding MISFET forming region. The gate insulative film 7 is formed to a thickness (about 7 to 8 nm) which is larger than the thickness of the gate insulative film 6 (about 3 to 4 nm) in order to ensure the required voltage withstanding. That is, the gate insulative film 6 in the memory array forming region and the gate insulative film 6 in the low voltage withstanding MISFET forming region are an identical film formed by an identical step. As will be described later, the gate insulative film 6 of the memory array forming region constitutes the gate insulative film of the control gate 8. Accordingly, the memory cell can be operated at a high speed by constituting the gate insulative film of the control gate 8, not with the gate insulative film 7 of the high voltage withstanding MISFET, but with the gate insulative film 6 of the low voltage withstanding MISFET.

Figure 4:
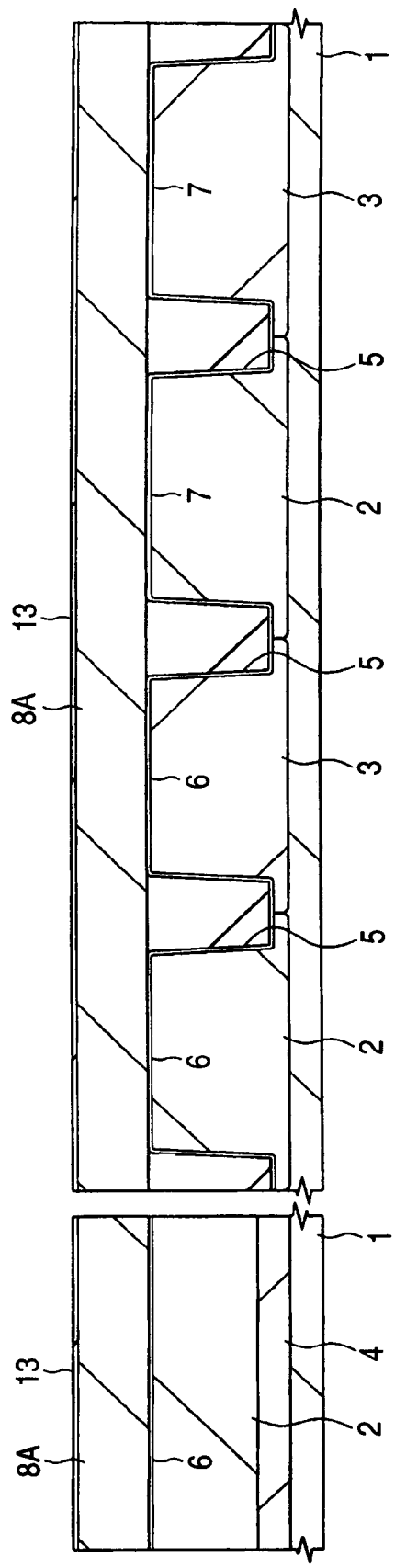
FIG. 4 is a cross sectional view of a main portion of a semiconductor substrate showing a step in the method of manufacturing an MONOS type non-volatile memory succeeding the step shown in FIG. 3.

Then, as shown in FIG. 4, after depositing an undoped silicon film 8A to about 250 nm in thickness over the substrate 1 by a CVD method, a thin silicon oxide film 13 is deposited thereover by a CVD method in order to protect the surface of the undoped silicon film 8A.

Figure 5:
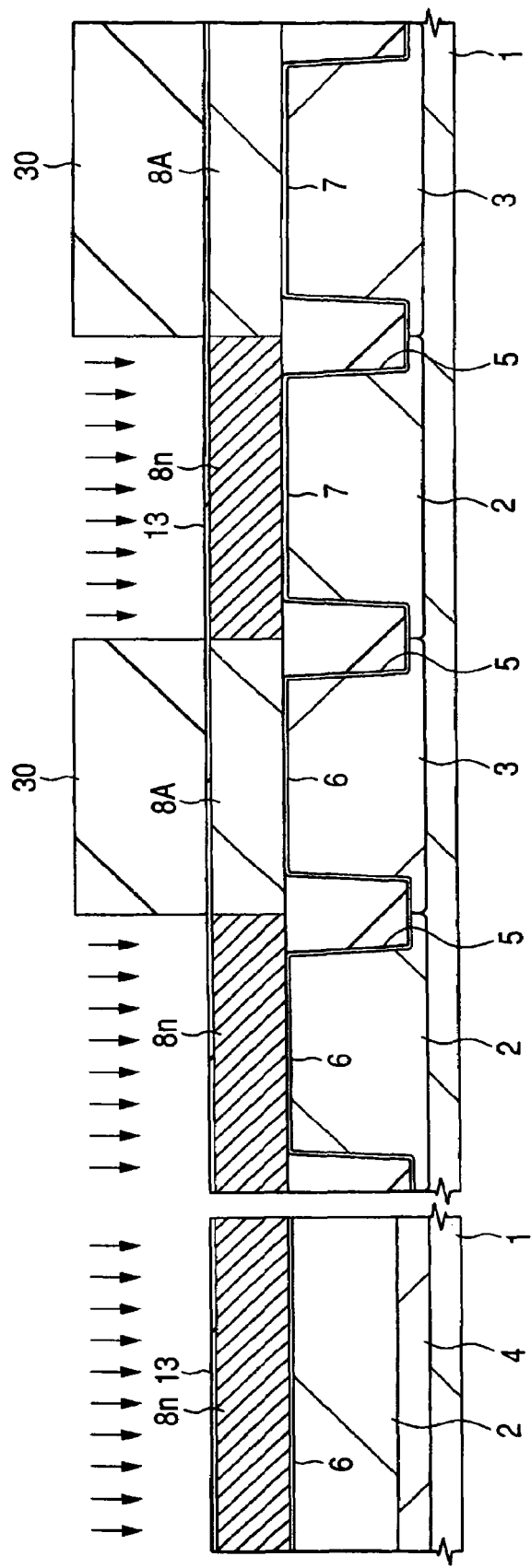
FIG. 5 is a cross sectional view of a main portion of a semiconductor substrate showing a step in the method of manufacturing an MONOS type non-volatile memory succeeding the step shown in FIG. 4.

Then, as shown in FIG. 5, the undoped silicon film 8A of the p-channel type MISFET forming region (n-type well 3) in the peripheral circuit forming region is covered with a photoresist film 30, and impurities (phosphorous or arsenic) are ion implanted into the undoped silicon film 8A in the n-channel type MISFET forming region and the memory array forming region, thereby converting the undoped silicon film 8A in the regions into a n-type silicon film 8*n*. In a case where the impurity is phosphorous, the amount of the dose is about $6 \times 10^{15}$ atoms/cm$^2$. Then, the undoped silicon film 8A in the p-channel type MISFET forming region may also be optionally converted into a p-type silicon film. In this case, the undoped silicon film 8A in the n-channel type MISFET forming region (p-type well 2) is covered with a photo resist film, and impurities (boron or boron fluoride) are ion implanted to the undoped silicon film 8A in the p-channel type MISFET forming region, thereby converting the undoped silicon film 8A in the regions into a p-type silicon film.

Figure 6:
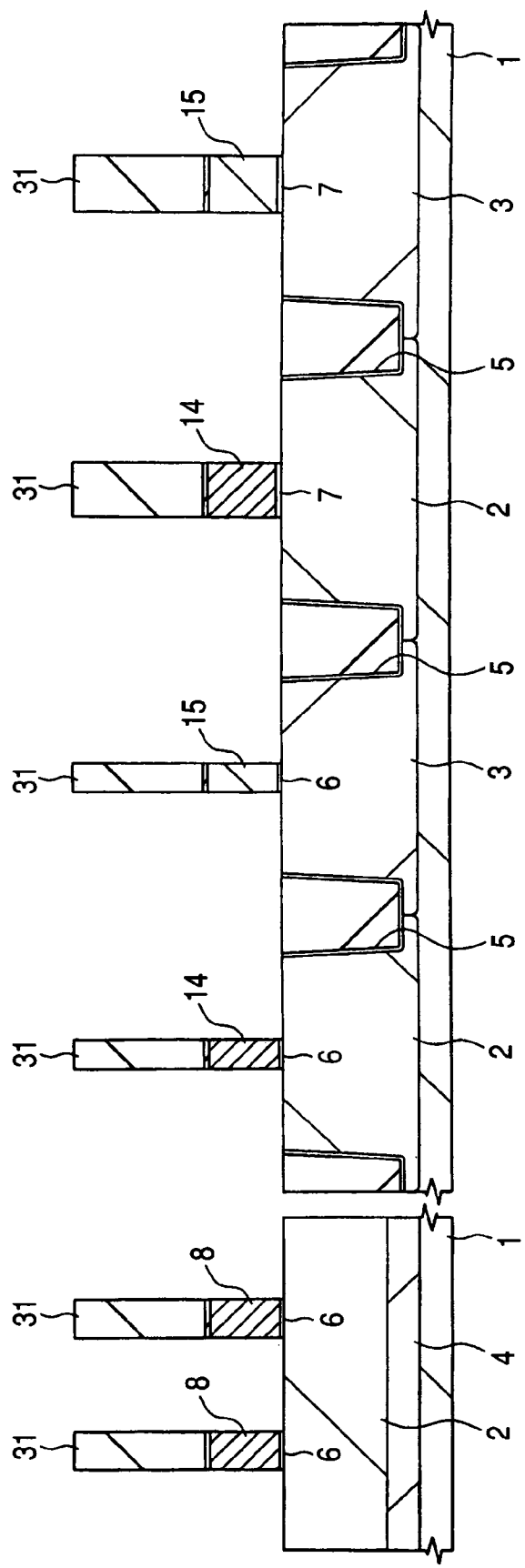
FIG. 6 is a cross sectional view of a main portion of a semiconductor substrate showing a step in the method of manufacturing an MONOS type non-volatile memory succeeding the step shown in FIG. 5.

Then, as shown in FIG. 6, the silicon oxide film 13, the undoped silicon film 8A and the n-type silicon film 8*n* are dry etched using a photo resist film 31 as a mask. By this process, a control gate 8 comprising the n-type silicon film 8*n* is formed in the memory array forming region, and a gate electrode 14 comprising the n-type silicon film 8*n* is formed in the n-channel type MISFET forming region (p-type well 2) of the peripheral circuit region. Further, a gate electrode 15 comprising the undoped silicon film 8A is formed in the p-channel type MISFET forming region (n-type well 3) of the peripheral circuit region. The gate electrode 15 comprising the undoped silicon film 8A is converted into a p-type silicon film by ion implantation of impurities (boron) in a subsequent step. As described above, by locally changing the type of impurities that are ion implanted to the undoped silicon film 8A, since the control gate 8 of the memory cell and the gate electrodes 14, 15 of the peripheral circuit forming region can be formed simultaneously by using the undoped silicon film 8A, the gate forming steps can be simplified.

The gate length of the control gate 8 formed in the memory array forming region is about 180 nm. In a case where the gate length of the control gate 8 is shortened to about 180 nm, the aspect ratio of the control gate 8 (ratio of the height relative to the length of the gate) is larger than 1. Since the fabrication of the control gate 8 becomes difficult when the control gate 8 of such a high aspect ratio is intended to be formed after the formation of the memory gate 9, the memory gate 9 is formed after the formation of the control gate 8 in this embodiment. Further, this makes it possible to form a memory gate 9, having a gate length that is even smaller than that of the control gate 8, to the side wall of the control gate 8.

Figure 7:
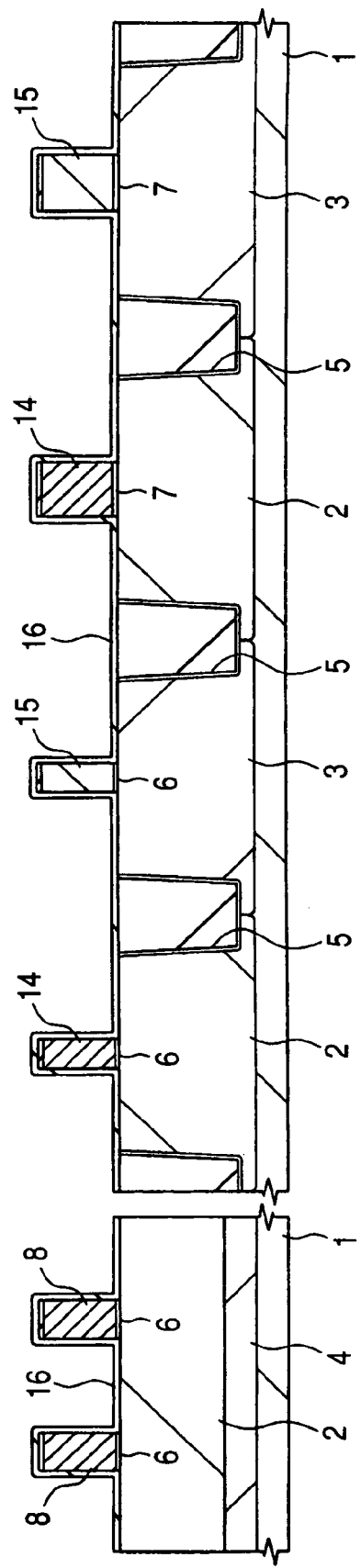
FIG. 7 is a cross sectional view of a main portion of a semiconductor substrate showing a step in the method of manufacturing an MONOS type non-volatile memory succeeding the step shown in FIG. 6.

Then, as shown in FIG. 7, a charge accumulation layer 16 is formed over the substrate 1. The charge accumulation layer 16 is constituted of three-layered films of a silicon oxide film, a silicon nitride film and a silicon oxide film. Among the three-layered films, the lower silicon oxide film is formed by a thermal oxidation method or a CVD method. Alternatively, this film may be formed by using an ISSG (In Situ Steam Generation) method of directly introducing hydrogen and oxygen in a chamber of a thermal oxidation apparatus and conducting radical oxidizing reaction on a heated wafer. The silicon nitride film is formed by a CVD method or an ALD (atomic layer deposition) method, and the upper silicon oxide layer is formed by a CVD method or an ISSG oxidizing method. Also, after forming the lower silicon oxide film and before forming the silicon nitride film, nitrogen may be segregated to the boundary between the silicon oxide film and the substrate 1 (p-type well 2, n-type well 3) by subjecting the silicon oxide film to a nitriding treatment in a high temperature atmosphere containing silicon oxides such as $N_2O$. By this nitriding treatment, since the hot carrier resistance of the control transistor and the memory transistor constituting the memory cell is improved, the memory cell characteristics (for example, the rewriting characteristics) are improved.

Further, after forming the control gate 8, and before the step of forming the charge accumulation layer 16, impurities for controlling the threshold voltage of the control transistor or impurities for controlling the threshold voltage of the memory transistor may be ion implanted to the p-type well 2 of the memory array forming region. This can optimize the threshold values for the control transistor and the memory transistor.

Figure 8:
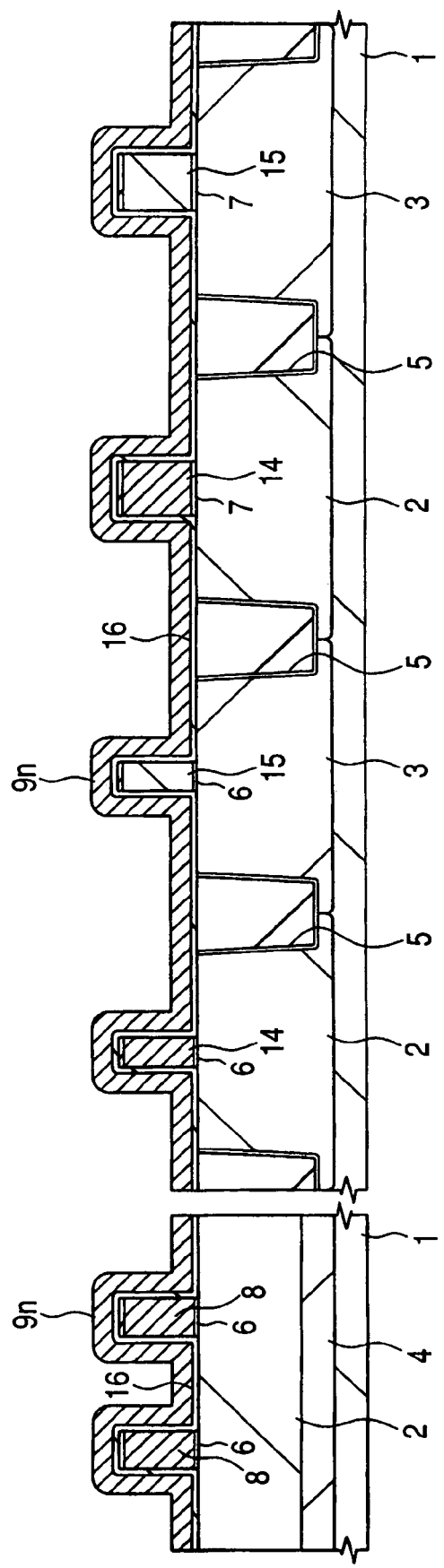
FIG. 8 is a cross sectional view of a main portion of a semiconductor substrate showing a step in the method of manufacturing an MONOS type non-volatile memory succeeding the step shown in FIG. 7.

Then, a memory gate 9 is formed on one of the side walls of the control gate 8. For forming the memory gate 9, an n-type polycrystal silicon film 9n is deposited over the substrate 1 at first by a CVD method as shown in FIG. 8.

Figure 9:
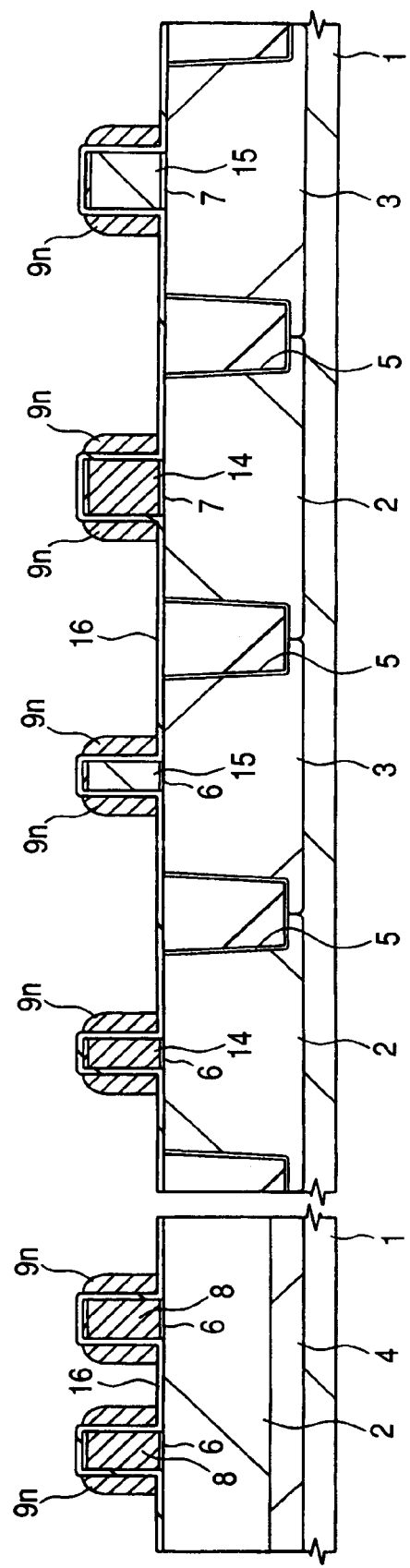
FIG. 9 is a cross sectional view of a main portion of a semiconductor substrate showing a step in the method of manufacturing an MONOS type non-volatile memory succeeding the step shown in FIG. 8.

Then, as shown in FIG. 9, the n-type polycrystal silicon film 9n is anisotropically etched to leave the n-type polycrystal silicon film 9n on both side walls of the control gate 8 and on both side walls of the gate electrodes 14, 15 of the peripheral circuit. The concentration of the impurities (phosphorus or arsenic) of the n-type polycrystal silicon film 9n is about $1 \times 10^{20}$ atoms/cm$^3$ to $6 \times 10^{20}$ atoms/cm$^3$.

Figure 10:
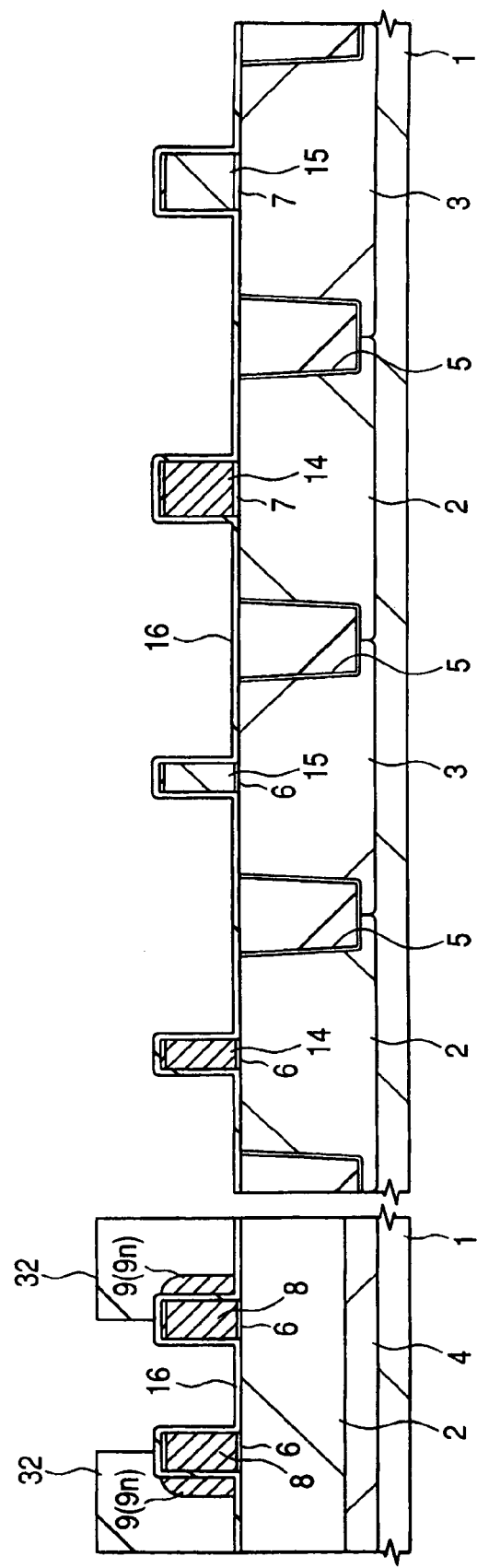
FIG. 10 is a cross sectional view of a main portion of a semiconductor substrate showing a step in the method of manufacturing an MONOS type non-volatile memory succeeding the step shown in FIG. 9.

Then, as shown in FIG. 10, the n-type polycrystal silicon film 9n is etched using a photoresist film 32 as a mask for covering the memory gate forming region. Thus, a memory gate 9 comprising the n-type polycrystal silicon film 9n is formed to one of the side walls of the control gate 8.

The gate length of the memory gate 9, which is formed on the side wall of the control gate 8, is about 80 nm, and the aspect ratio (ratio of the height relative to the length of the gate) thereof is larger than 1. In this embodiment, since the memory gate 9 is formed after forming the control gate 8, the memory gate 9, having a high aspect ratio and an even smaller gate length than the gate control 8, can be formed easily.

As described above, in the MONOS type non-volatile memory of this embodiment, writing is conducted by injecting hot electrons, that are generated in the channel region near the intermediate portion between the control gate 8 and the memory gate 9, into the charge accumulation layer 16, and erasing is conducted by injecting hot holes, that are generated in the channel region at the end on the side of the source region 10s, into the charge accumulation layer 16.

By the way, since the electrons and holes injected into the charge accumulation layer 16 are captured by traps in the silicon nitride film and can not move freely through the silicon nitiride film, in a case where the location for generation of the hot electrons and the location for generation of the hot holes are spaced apart, the position for the electrons and the position for the holes injected into the charge accumulation layer 16 are also spaced apart; and, as a result, the erasing efficiency of the electrons by the holes is lowered, thereby resulting in problems, such as a delay of the erasing time, a deterioration of the rewriting resistance and a deterioration of the data retention characteristics, as described above. On the contrary, in the MONOS-type non-volatile memory according to this embodiment, since the gate length of the memory gate 9 is extremely small and, accordingly, the location for generation of the hot electrons and the location for generation of the hot holes are dose to each other, the electrons can be erased efficiently by the holes.

Further, in this embodiment, while the control gate 8 is formed by ion implanting impurities into the undoped silicon film 8A, the memory gate 9 is formed by using the n-type polycrystal silicon film 9n. Since the electric resistance of the so-called doped polysilicon film (n-type polycrystal silicon film 9n) formed by introducing impurities upon film formation can be lowered compared with a case of ion implanting impurities after film formation, the sheet resistance of the memory gate 9 formed of the n-type polycrystal silicon film 9n (about 80Ω□) is lower than the sheet resistance of the control gate 8 (about 120Ω□). Further, since the number of masks used for ion implantation can be decreased, the manufacturing steps can be simplified.

Figure 11:
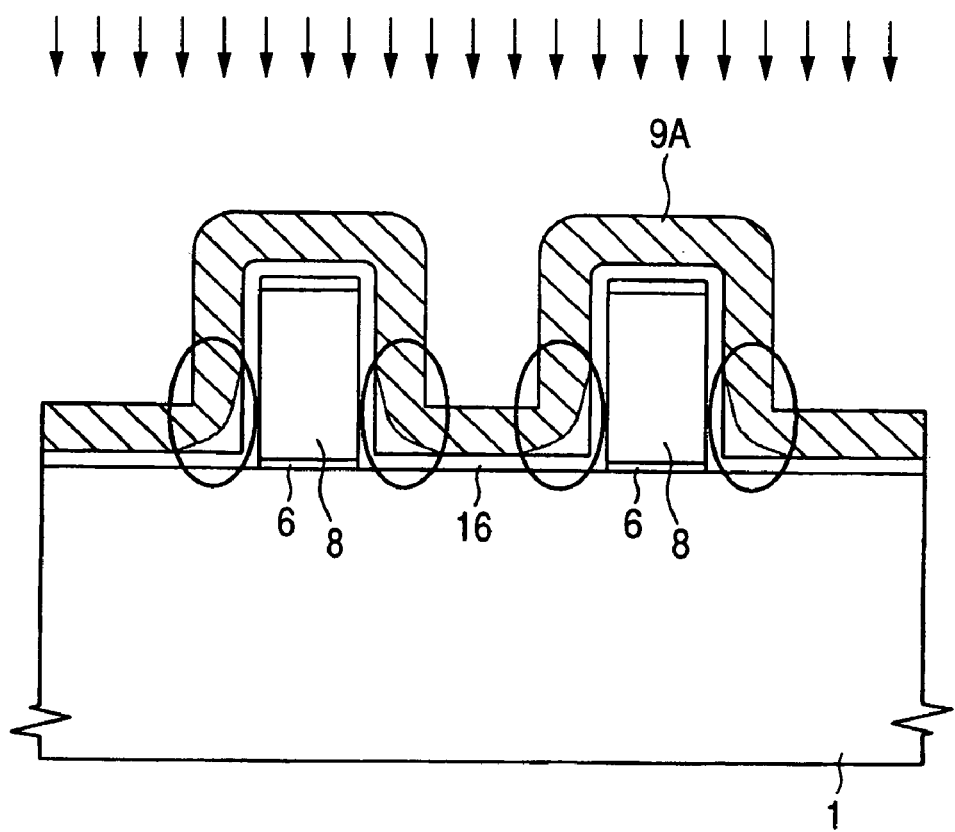
FIG. 11 is a diagram which illustrates problems in a case of forming a memory gate by ion implanting impurities after the deposition of an undoped silicon film.

Further, when a method of ion implantation to the undoped silicon film was used, it was found that the following problem occurred. As shown in FIG. 11, in the low resistance silicon film formed by implantation of impurities into an undoped silicon film, since the impurities do not sufficiently reach as far as the bottom of the film, they form a region with no ion implantation or a region where the concentration of the impurities is lower compared with other regions (regions shown by arrows in the drawing). This increases the resistance at the bottom of the film. Accordingly, in a case of forming the memory gate 9 by using the silicon film described above, since a depletion layer tends to be formed near the boundary with the charge accumulation layer 16, which is formed below the memory gate 9, upon application of the voltage to the memory gate 9, the driving performance of the memory transistor ($M_1$) is lowered.

According to this embodiment of forming the memory gate 9 by using the doped polysilicon film (n-type polycrystal silicon film 9n), since the resistance of the memory gate 9 can be lowered, no large switching noises are formed at the memory gate 9 even when the control transistor is turned to ON/OFF at a high speed for reading, as described above.

Figure 12:
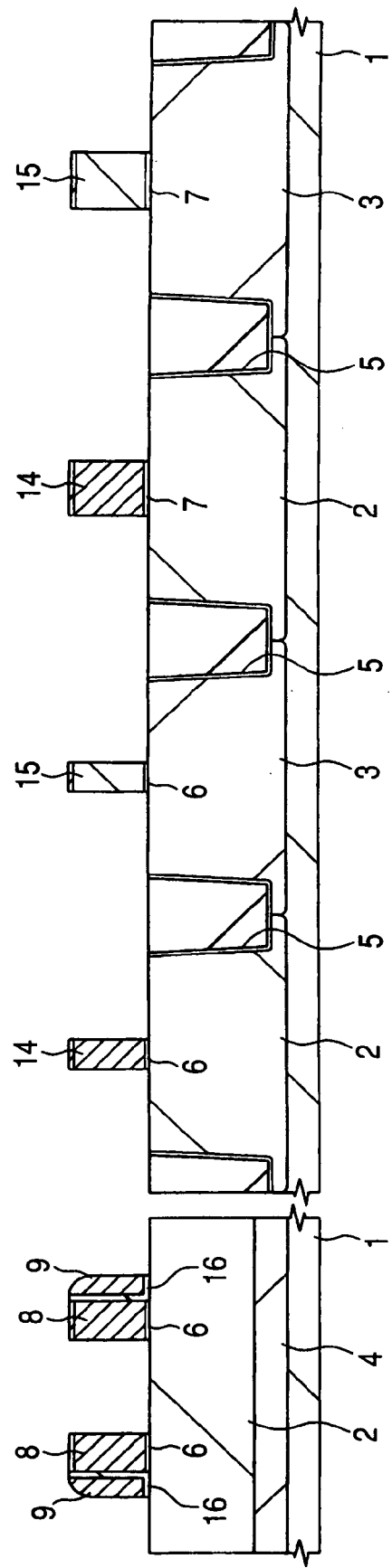
FIG. 12 is a cross sectional view of a main portion of a semiconductor substrate showing a step in the method of manufacturing an MONOS type non-volatile memory succeeding the step shown in FIG. 10.

Then, as shown in FIG. 12, three-layered insulative films constituting the charge accumulation layer 16 are etched by using hydrofluoric acid and phosphoric acid. This removes the charge accumulation layer 16 that is formed in unnecessary regions, and the charge accumulation layer 16 is left only on one side wall of the control gate 8 and below the memory gate 9.

Figure 13:
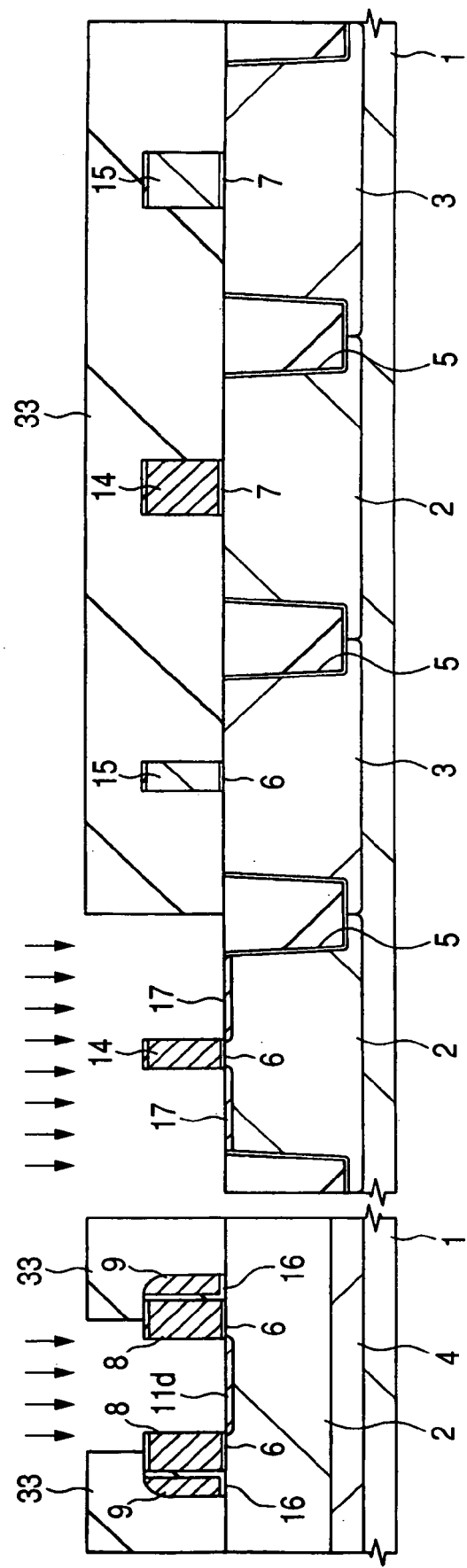
FIG. 13 is a cross sectional view of a main portion of a semiconductor substrate showing a step in the method of manufacturing an MONOS type non-volatile memory succeeding the step shown in FIG. 12.

Then, as shown in FIG. 13, impurities (phosphorus or arsenic) are ion implanted to the low voltage withstanding n-channel type MISFET forming region using a photoresist film 33 as a mask to form an n$^-$-type semiconductor region 17. In this case, impurities (phosphorus or arsenic) are ion implanted also to a portion of the memory array forming region, thereby forming an n⁻-type semiconductor region 11d. The n⁻-type semiconductor region 17 is an extension region for forming the low voltage withstanding n-channel type MISFET into an LDD structure, and the n⁻-type semiconductor region 11d is an extension region for forming the control transistor of the memory cell into an LDD structure.

In a case where it is intended to optimize the impurity concentration of the n⁻-type semiconductor region 11d and the impurity concentration of the n⁻-type semiconductor region 17, the ion implantation may be conducted twice, separately, by using two sheets of photomasks. Further, while ion implantation for forming the n⁻-type semiconductor region 11d and the n⁻-type semiconductor region 17 may be conducted before removal of the charge accumulation 16, it is preferably conducted after the removal of the charge accumulation layer 16 for forming a shallow pn-junction. Although not illustrated, p-type impurities may also be implanted to the extension region by using a mask. The p-type impurity region is formed below the n⁻-type semiconductor region 11d and n⁻-type semiconductor region 17, and it functions as a region for suppressing the short channel effect of the memory cell and the low voltage withstanding n⁻-channel type MISFET (hallow region).

Figure 14:
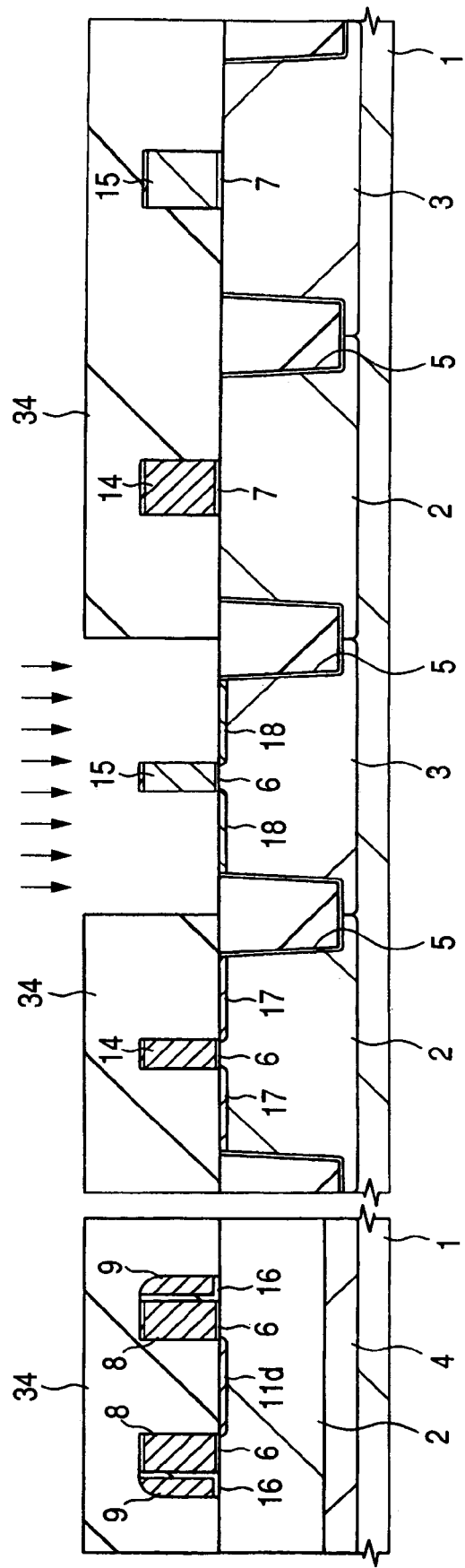
FIG. 14 is a cross sectional view of a main portion of a semiconductor substrate showing a step in the method of manufacturing an MONOS type non-volatile memory succeeding the step shown in FIG. 13.

Then, as shown in FIG. 14, impurities (boron) are ion implanted to the low voltage p-channel type MISFET forming region of the peripheral circuit by using a photoresist film 34 as a mask, thereby forming a p⁻-type semiconductor region 18. The p⁻-type semiconductor region 18 is an extension region for forming the low voltage withstanding p-channel type MISFET into an LDD structure. Although not illustrated, n-type impurities may also be implanted to the extension region. The n-type impurity region is formed below the p⁻-type semiconductor region 18, and it functions as a region for suppressing the short channel effect of the low voltage withstanding p-channel type MISFET (hallow region).

Figure 15:
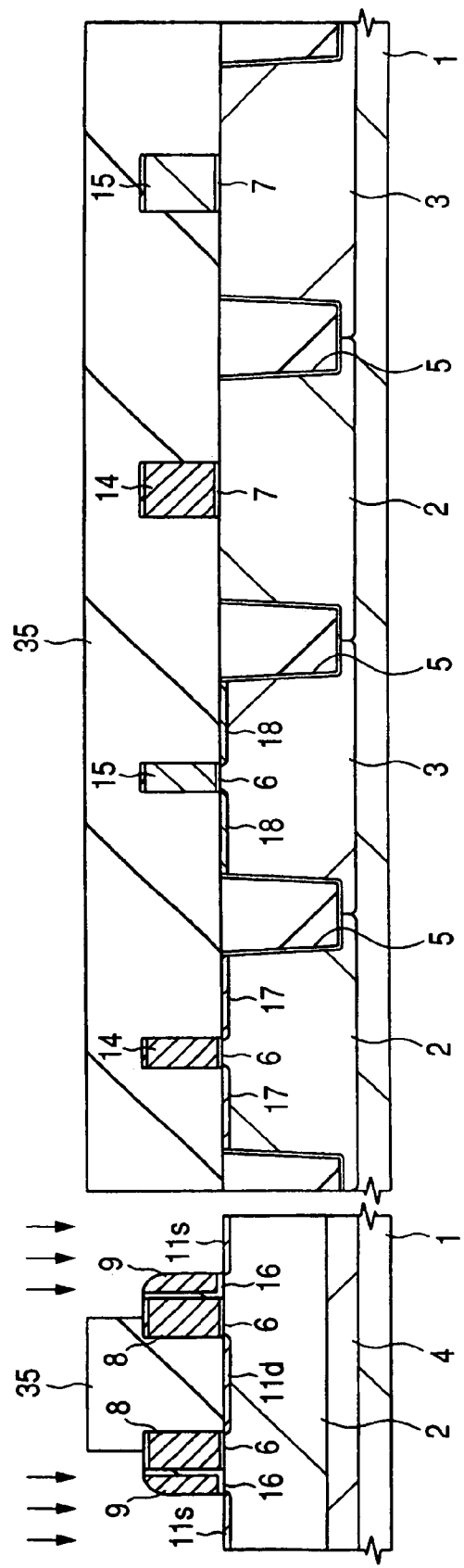
FIG. 15 is a cross sectional view of a main portion of a semiconductor substrate showing a step in the method of manufacturing an MONOS type non-volatile memory succeeding the step shown in FIG. 14.

Then, as shown in FIG. 15, impurities (phosphorus or arsenic) are ion implanted to a portion of the memory array forming region by using a photoresist film 35 as a mask, thereby forming an n⁻-type semiconductor region 11s. The n⁻-type semiconductor region 11s is an extension region for forming the memory transistor of the memory cell into an LDD structure. While ion implantation for forming the n-type semiconductor region 11s may be conducted before removal of the charge accumulation layer 16, the ion implantation is conducted preferably after removal of the charge accumulation layer 16 for forming a shallow pn-junction. Further, although not illustrated, p-type impurities may also be implanted to the extension region by using a mask. The p-type impurity region is formed below the n⁻-type semiconductor region 11s, and it functions as a region suppressing the short channel effect of the memory cell (hallow region).

Figure 16:
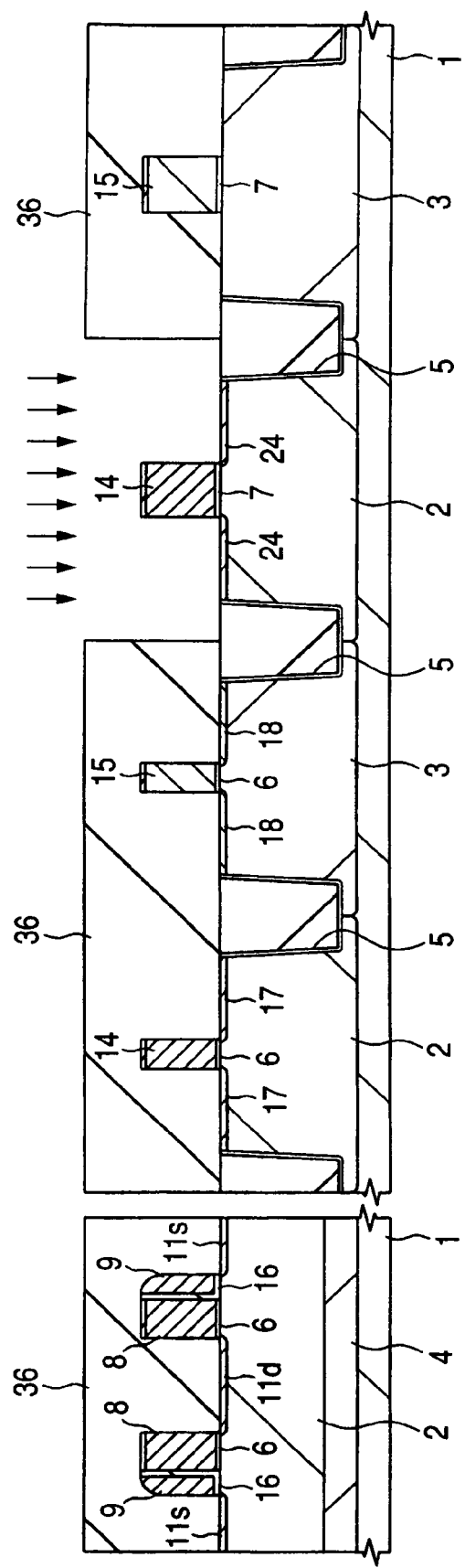
FIG. 16 is a cross sectional view of a main portion of a semiconductor substrate showing a step in the method of manufacturing an MONOS type non-volatile memory succeeding the step shown in FIG. 15.

Then, as shown in FIG. 16, impurities (phosphorus or arsenic) are ion implanted to the high voltage withstanding n-channel type MISFET forming region of the peripheral circuit by using a photoresist film 36 as a mask thereby forming an n⁻-type semiconductor region 24. The n⁻-type semiconductor region 24 is an extension region for forming the high voltage withstanding n-channel type MISFET into an LDD structure. Although not illustrated, p-type impurities may also be implanted to the extension region by using a mask. The p-type impurity region is formed below the n⁻-type semiconductor region 24, and it functions as a region for suppressing the short channel effect of the high voltage withstanding n-channel type MISFET (hallow region).

Figure 17:
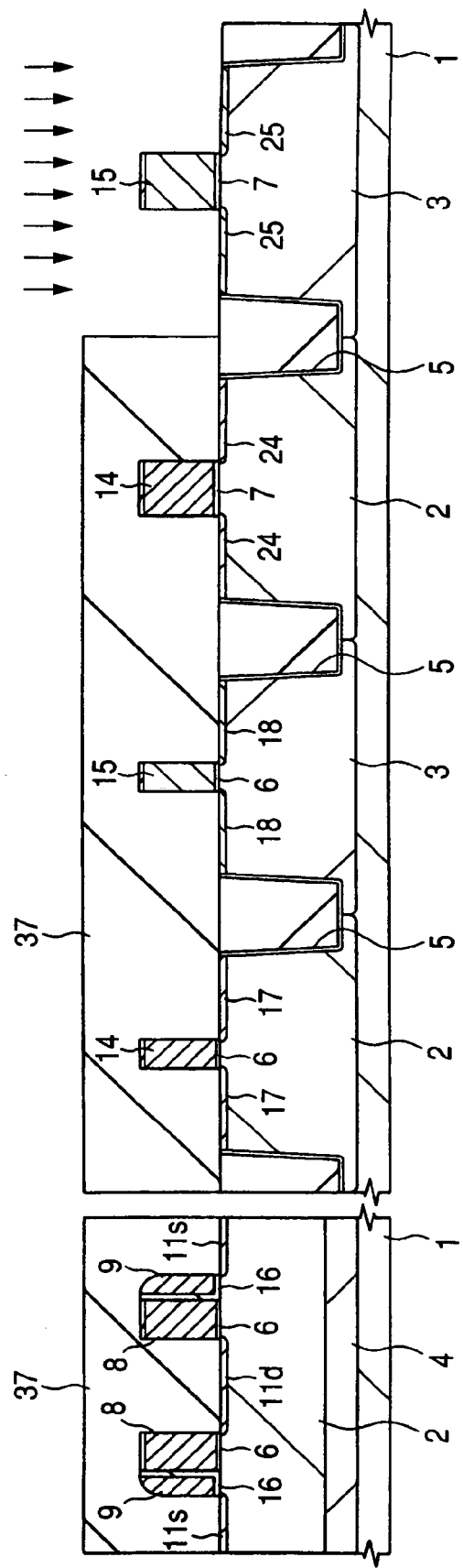
FIG. 17 is a cross sectional view of a main portion of a semiconductor substrate showing a step in the method of manufacturing an MONOS type non-volatile memory succeeding the step shown in FIG. 16.

Then, as shown in FIG. 17, impurities (boron) are ion implanted into the high voltage withstanding p-channel type MISFET forming region of the peripheral circuit by using a photoresist film 37 as a mask to form a p⁻-type semiconductor region 25. The p⁻-type semiconductor region 25 is an extension region for forming the high voltage withstanding p-channel type MISFET into an LDD structure. Although not illustrated, n-type impurities may also be implanted into the extension region by using a mask. The n-type impurity region is formed below the p⁻-type semiconductor region 25, and it functions as a region for suppressing the short channel effect of the high voltage withstanding p-channel type MISFET (hallow region).

Figure 18:
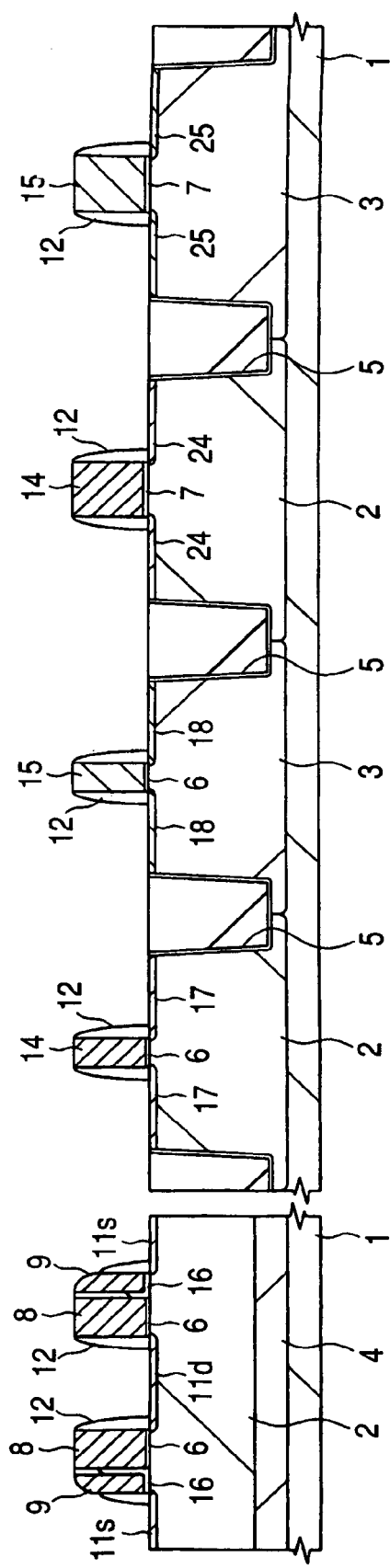
FIG. 18 is a cross sectional view of a main portion of a semiconductor substrate showing a step in the method of manufacturing an MONOS type non-volatile memory succeeding the step shown in FIG. 17.

Then, as shown in FIG. 18, side wall spacers 12 are formed to one of the side walls for the control gate 8 and the memory gate 9 in the memory array forming region, respectively, and side wall spacers 12 are formed to both of the side walls of the gate electrode 14 and the gate electrode 15 of the peripheral circuit forming region, respectively. The side wall spacer 12 is formed by anisotropically etching the silicon oxide film deposited over the substrate 1 by a CVD method.

Figure 19:
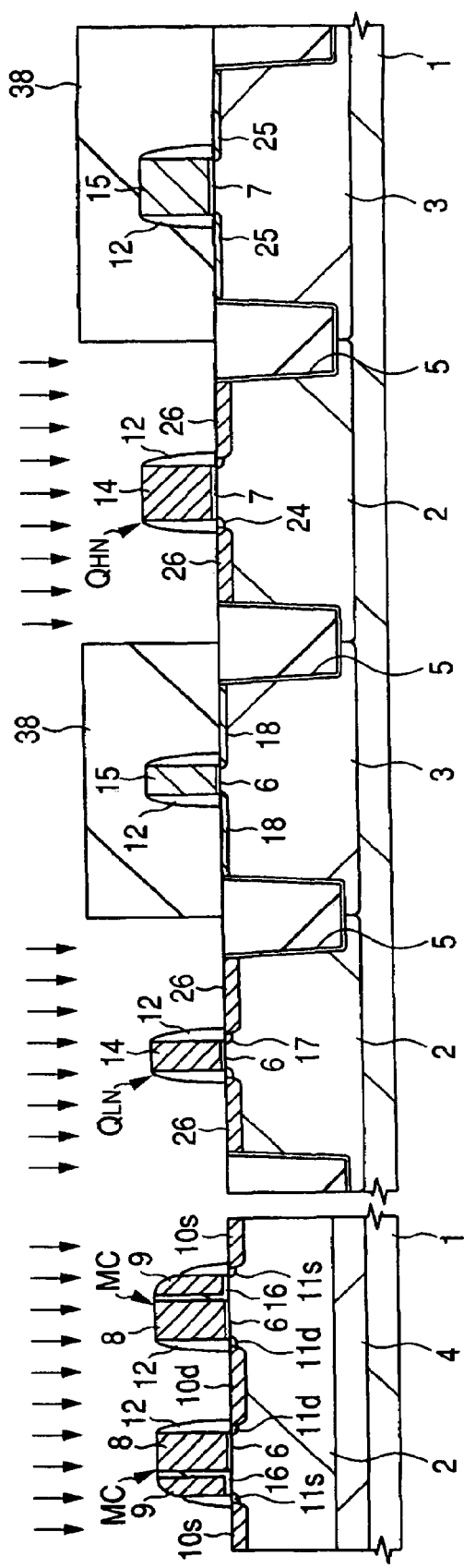
FIG. 19 is a cross sectional view of a main portion of a semiconductor substrate showing a step in the method of manufacturing an MONOS type non-volatile memory succeeding the step shown in FIG. 18.

Then, as shown in FIG. 19, impurities (phosphorus or arsenic) are ion implanted to the memory array forming regions and the n-channel type MISFET forming region of the peripheral circuit region by using a photoresist film 38 as a mask. Thus, an n⁺-type semiconductor region (drain region) 10d and an n⁺-type semiconductor region (source region) 10s are formed in the memory array forming region to complete a memory cell MC. Further, n⁺-type semiconductor regions (source region and drain region) 26 are formed in the peripheral circuit forming region to complete a low voltage withstanding n-channel type MISFET ($Q_{LN}$) and a high voltage withstanding n-channel type MISFET ($Q_{HN}$).

In the ion implantation step for forming the source and drain regions (10s, 10d, and 26) described above, impurities are implanted also to the control gate 8 and the memory gate 9. Further, in the ion implantation, the dose rate of the impurities is high (about $1\times10^{13}$ atoms/cm²) and the implantation energy is also higher (about 40 KeV) compared with the ion implantation used for forming the extension regions (11s, 11d, 17, 24). Accordingly, in a case where the impurities implanted into the control gate 8 and the memory gate 9 pass through the gate insulative film 6 or the charge accumulation layer 16 therebelow and reach the surface of the p-type well 2, the threshold voltage for the control transistor and the memory transistor fluctuates.

Figure 20:
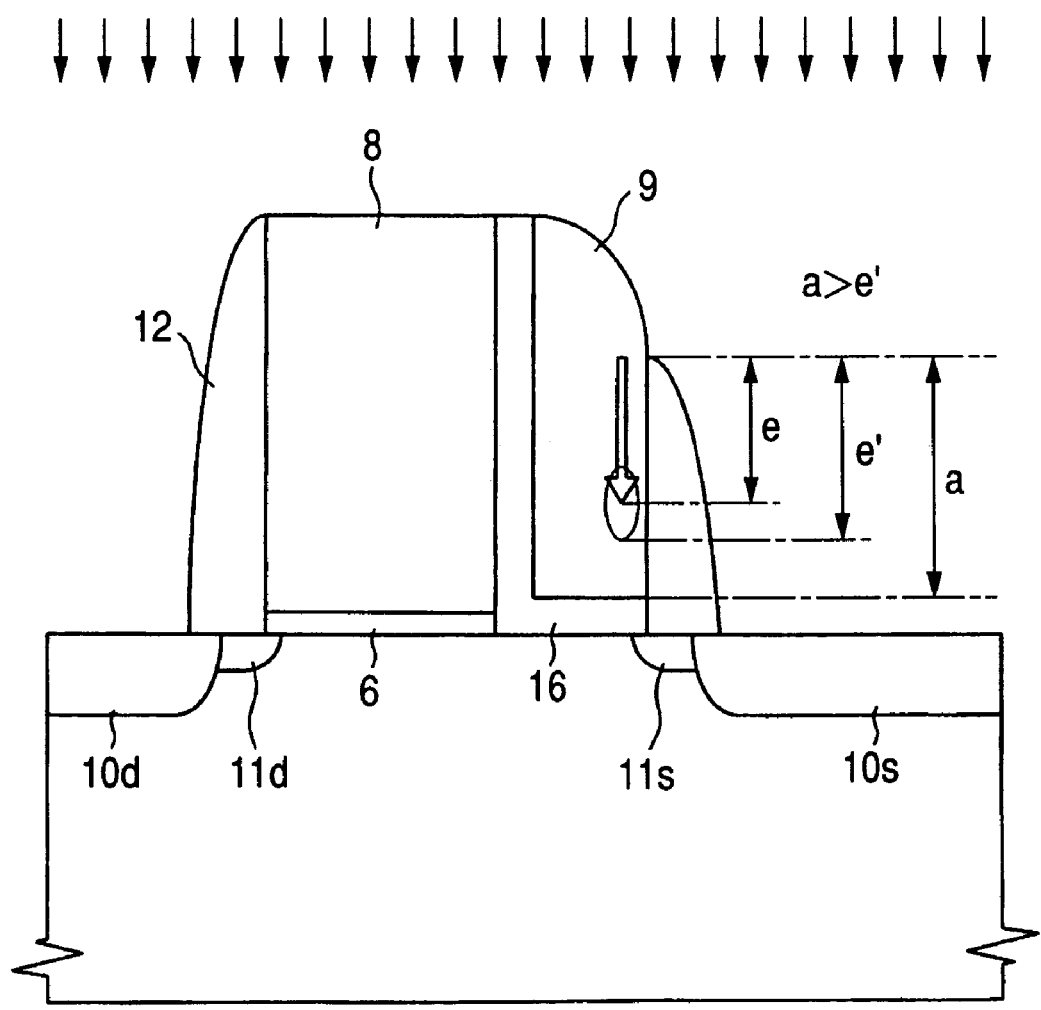
FIG. 20 is a diagram illustrating a relation between the diffusion distance of impurities implanted to the memory gate in the direction of a substrate and the film thickness of a memory gate.

As shown in FIG. 20, in the memory gate 9, the portion most remote from the control gate 8 has a least film thickness (film thickness=a). Accordingly, in the ion implantation step described above, it is necessary to control the implantation energy such that the diffusion distance of the impurities implanted into the memory gate 9 relative to the direction of the substrate does not exceeds the film thickness (a) at the portion most remote from the control gate 8. That is, assuming that the average diffusion distance of the impurities implanted into the memory gate 9 in the direction of the substrate is "e", and the maximum diffusion distance considering the scattering of the diffusion distance is "e'", the implantation energy is controlled such that the maximum diffusion distance "e'" does not exceeds the film thickness (a) as: (a>e').

Figure 21:
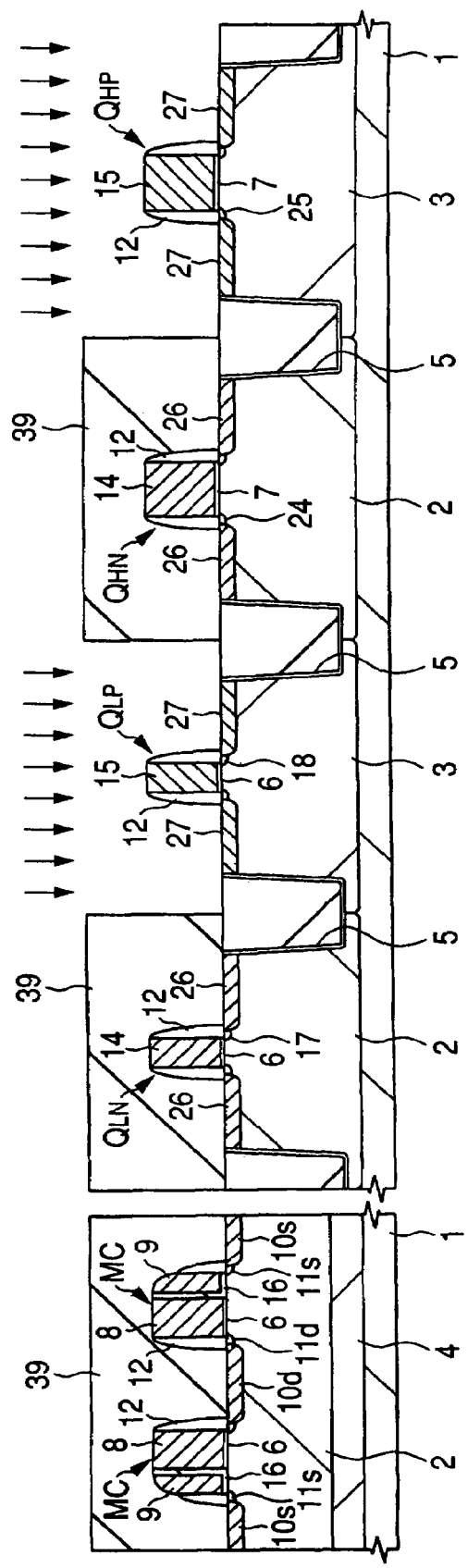
FIG. 21 is a cross sectional view of a main portion of a semiconductor substrate showing a step in the method of manufacturing an MONOS type non-volatile memory succeeding the step shown in FIG. 19.

Then, as shown in FIG. 21, impurities (boron) are ion implanted into the p-channel type MISFET forming region of the peripheral circuit by using a photoresist film 39 as a mask. Thus, p⁺-type semiconductor regions (source region and drain region) 27 are formed in the peripheral circuit forming region, to complete the formation of a low voltage withstanding p-channel type MISFET ($Q_{LP}$) and a high voltage withstanding channel type MISFET ($Q_{HP}$). Further, in the ion implantation step for forming the source and drain regions (27), since the impurities are implanted also to the gate electrode 15 of the p-channel type MISFET ($Q_{LP}$, $Q_{HP}$), the silicon film constituting the gate electrode 15 is converted into a low resistance p-type silicon film. This can save the step of ion-implanting impurities into the silicon film that constitutes the gate electrode 15 and the photomask used therein. Further, in the ion implantation step for forming the source and drain regions (27) impurities can also be ion implanted without using the photoresist film 39. This can further decrease the number of photomasks. However, since the impurities are ion implanted also into the low voltage withstanding n-channel type MISFET ($Q_{LN}$) and the high voltage withstanding n-channel type MISFET ($Q_{HN}$), it is necessary to take the characteristic fluctuations thereof into consideration.

Figure 22:
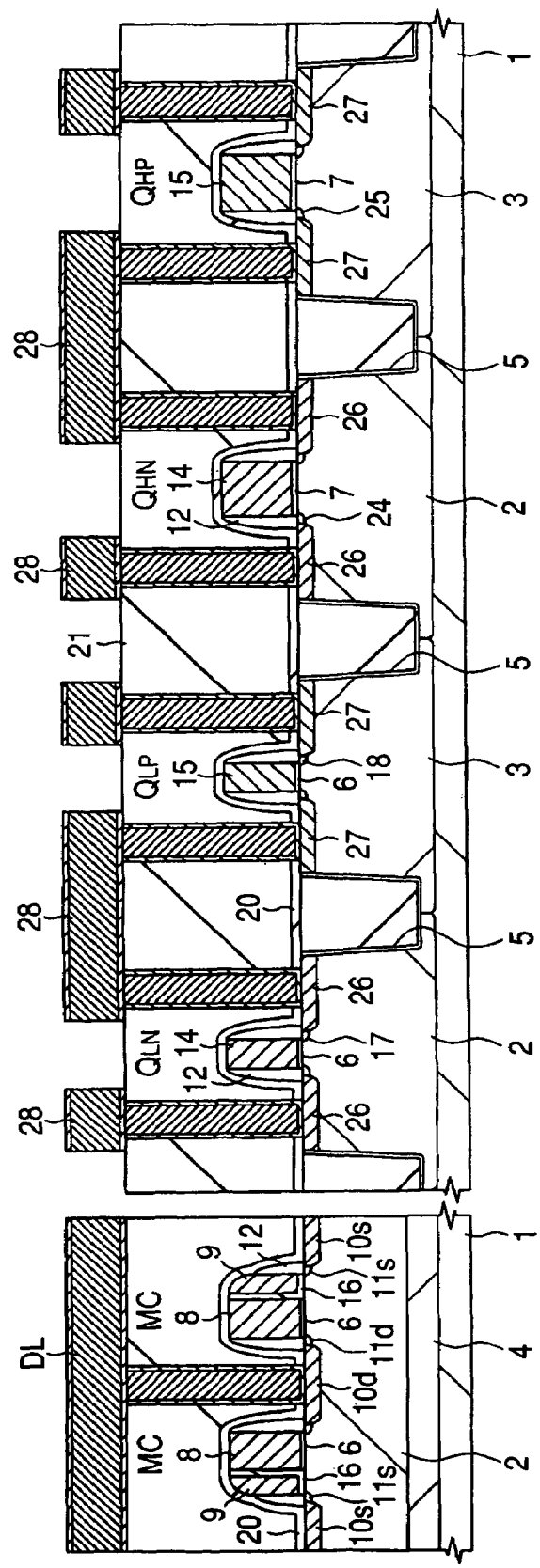
FIG. 22 is a cross sectional view of a main portion of a semiconductor substrate showing a step in the method of manufacturing an MONOS type non-volatile memory succeeding the step shown in FIG. 21.

Then, as shown in FIG. 22, after depositing a silicon nitride film 20 and a silicon oxide film 21 over the substrate 1 by a CVD method, data lines DL are formed over the silicon oxide film 21 of the memory array forming region and interconnections 28 are formed in the peripheral circuit forming region. Then, plural interconnections are formed above the interconnections 28 with an interlayer insulative film being disposed therebetween, which are not illustrated. It is also possible to form a silicide layer, such as a layer of cobalt silicide, on the surface of the control gate 8, the memory gate 9, the source region 10s, and the drain region 10d of the memory cell MC (and the gate electrode, source region, drain region of the MISFET in the peripheral circuit) prior to the step of forming the silicon nitride film 20 over the substrate 1, thereby further reducing the resistance of the control gate 8, the memory gate 9, etc.

While the invention made by the present inventors has been described specifically based on preferred embodiments thereof, it will be apparent that the invention is not restricted to the embodiments described above, but can be changed variously within a range not departing the gist thereof.

The present invention is utilized for a non-volatile semiconductor memory device having an MONOS type transistor.

What is claimed is:

1. A method of manufacturing a non-volatile semiconductor memory device having a memory cell comprising:
    a control gate formed over a first gate insulative film formed over a first p-type well of a main surface of a semiconductor substrate;
    a charge accumulation layer having a first portion formed on one of side walls of said control gate and a second portion formed over said first p-type well;
    a memory gate formed on said one of side walls of said control gate, electrically separated by said first portion of said charge accumulation layer from said control gate and electrically separated by said second portion of said charge accumulation layer from said first p-type well;
    a drain region of a second conductive type formed in said first p-type well with one end thereof being disposed near said control gate; and
    a source region of said second conductive type formed in said first p-type well with one end thereof being disposed near said memory gate,
    said method comprising steps of:
    (a) forming said first gate insulative film over said surface of said first p-type well and forming an undoped silicon film over said first gate insulative film;
    (b) ion implanting impurities into said undoped silicon film to convert said undoped silicon film into an n-type first silicon film;
    (c) patterning said n-type silicon film and said first gate insulative film to form said control gate comprising said n-type first silicon film while leaving said first gate insulative film below said control gate;
    (d) forming a first insulative film so as to cover said surface of said first p-type well and said side walls and said upper surface of said control gate;
    (e) forming an n-type second silicon film over said first insulative film and patterning said n-type second silicon film to form said memory gate comprising said n-type second silicon film on one of said side walls of said control gate;
    (f) removing said first insulative film in a region not in contact with said memory gate thereby forming said charge accumulation layer comprising said first insulative film with a first portion being disposed to one of said side walls of said control gate and a second portion thereof being disposed over said first p-type well; and
    (g) ion implanting impurities in said first p-type well to form said drain region of said second conduction type with one end thereof being disposed near said control gate and said source region of said second conductive type with one end thereof being disposed near said memory gate.

2. A method of manufacturing a non-volatile semiconductor memory device according to claim 1, further comprising the steps of:
    forming a low voltage n-channel type MISFET over a second p-type well of said main surface of said semiconductor substrate;
    forming a high voltage n-channel type MISFET over a third p-type well of said main surface of said semiconductor substrate;
    forming a low voltage p-channel type MISFET over a first n-type well of said main surface of said semiconductor substrate; and
    forming a high voltage p-channel type MISFET over a second n-type well of said main surface of said semiconductor substrate,
    wherein each of gate electrodes of said low voltage n-channel type MISFET, said high voltage n-channel type MISFET, said low voltage p-channel type MISFET, and said high voltage p-channel type MISFET is constituted with a silicon film formed by ion implanting impurities to an undoped silicon film that is the same layer as said undoped silicon film formed in said step (a).

3. A method of manufacturing a non-volatile semiconductor memory device according to claim 2, wherein each of said gate electrodes for said low voltage n-channel type MISFET and said high voltage n-channel type MISFET is constituted each with an n-type second silicon film formed by ion implanting impurities to said undoped silicon film, and each of said gate electrodes for said low voltage p-channel type MISFET and said high voltage p-channel type MISFET is formed each with a p-type first silicon film formed by ion implantation of impurities into said undoped silicon film.

4. A method of manufacturing a non-volatile semiconductor memory device according to claim 3, wherein said step of forming said p-type first silicon film by introducing the impurities into said undoped silicon film is a step identical with said step of forming said source region and said drain region for each of said low voltage p-channel type MISFET and said high voltage p-channel type MISFET by ion implantation of impurities into said first and second n-type wells.

5. A method of manufacturing a non-volatile semiconductor memory device according to claim 3, wherein said surface for said first, second and third p-type wells is not covered with a mask for ion implantation upon ion implantation of said impurities into said first and second n-type wells.

6. A method of manufacturing a non-volatile semiconductor memory device according to claim 1, wherein a height of said control gate is larger than a gate length of said control gate.

7. A method of manufacturing a non-volatile semiconductor memory device according to claim 2, wherein said source region and said drain region for each of said low voltage n-channel type MISFET and said high voltage n-channel type MISFET are formed by ion implantation of said impurities in each of said second p-type well and said third p-type well upon ion implantation of said impurities in said first p-type well in said step (g).

8. A method of manufacturing a non-volatile semiconductor memory device according to claim 2, further comprising a step of:
forming, in said first p-type well in a region adjacent with said drain region, a first extension region of said second conductive type having an impurity concentration being lower than that of said drain region, and a step of forming, in said first p-type well in a region adjacent with said source region, a second extension region of said second conductive type having an impurity concentration being lower than that of said source region,
wherein said ion implantation step for said impurities for forming said first and said second extension regions is applied subsequent to said step (f).

9. A method of manufacturing a non-volatile semiconductor memory device according to claim 8, wherein said step of forming said first extension region and said step of forming said second extension region are separate steps.

10. A method of manufacturing a non-volatile semiconductor memory device according to claim 1, wherein said charge accumulation layer comprises a silicon nitride film formed between two layers of silicon oxide films.

11. A method of manufacturing a non-volatile semiconductor memory device according to claim 1, wherein a writing operation to said memory cell is conducted by injecting hot electrons to said charge accumulation layer, and an erasing operation of said memory cell is conducted by injecting hot holes to said charge accumulation layer.

12. A method of manufacturing a non-volatile semiconductor memory device according to claim 1, wherein said ion implantation of said impurities to form said drain region and said source region is conducted at such an injection energy that the diffusion distance of said impurities implanted to said memory gate does not exceed a minimum film thickness of said memory gate.

13. A method of manufacturing a non-volatile semiconductor memory device according to claim 8, further comprising a step of:
forming, in said second p-type well, a third extension region of said second conductive type having an impurity concentration being lower than that of said source region and said drain region of said low voltage n-channel type MISFET,
wherein a step of forming said third extension region and a step of forming said first extension region in said first p-type well are the same step.

14. A method of manufacturing a non-volatile semiconductor memory device having a memory cell comprising:
a control gate formed over a first gate insulative film formed over a first p-type well of a main surface of a semiconductor substrate;
a charge accumulation layer having a first portion formed on one of side walls of said control gate and a second portion formed over said first p-type well;
a memory gate formed on one of side walls of said control gate, electrically separated by said first portion of said charge accumulation layer from said control gate and electrically separated by said second portion of said charge accumulation layer from said first p-type well;
a drain region of a second conductive type formed in said first p-type well with one end thereof being disposed near said control gate; and
a source region of said second conductive type formed in said first p-type well with one end thereof being disposed near said memory gate,
wherein a writing operation of said memory cell is conducted by injecting hot electrons to said charge accumulation layer and an erasing operation of said memory cell is conducted by injecting hot holes to said accumulation layer,
said method comprising steps of:
(a) forming said first gate insulative film over said surface of said first p-type well and forming a control gate comprising an n-type first silicon film formed over said first gate insulative film;
(b) forming a first insulative film so as to cover said surface of said first p-type well and said side walls and said upper surface of said control gate;
(c) forming an n-type second silicon film over said first insulative film and patterning said n-type second silicon film to form said memory gate comprising said n-type second silicon film on one of said side walls of said control gate;
(d) removing said first insulative film in a region not in contact with said memory gate to form said charge accumulation layer comprising said first insulative film with said first portion thereof being disposed to one of said side walls of said control gate and said second portion thereof being disposed over said first p-type well; and
(e) ion implanting impurities in said first p-type well to form said drain region of said second conductive type with one end thereof being disposed near said control gate and said source region of said second conductive type with one end thereof being disposed near said memory gate,
wherein a gate length of said memory gate is made smaller than a height of said memory gate.

15. A method of manufacturing a non-volatile semiconductor memory device according to claim 14, wherein said gate length of said memory gate is smaller than said gate length of said control gate.

* * * * *